(12) United States Patent
Tsorng et al.

(10) Patent No.: US 11,555,513 B2
(45) Date of Patent: Jan. 17, 2023

(54) MOUNTING SYSTEM

(71) Applicant: Quanta Computer Inc., Taoyuan (TW)

(72) Inventors: Yaw-Tzorng Tsorng, Taoyuan (TW); Ming-Lung Wang, Taoyuan (TW); Hong-Yi Huang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 28 days.

(21) Appl. No.: 17/137,517

(22) Filed: Dec. 30, 2020

(65) Prior Publication Data
US 2022/0112915 A1    Apr. 14, 2022

Related U.S. Application Data

(60) Provisional application No. 63/089,198, filed on Oct. 8, 2020.

(51) Int. Cl.
| | |
|---|---|
| *F16B 21/09* | (2006.01) |
| *F16M 13/02* | (2006.01) |
| *F16M 11/00* | (2006.01) |
| *H05K 5/02* | (2006.01) |
| *F16B 21/06* | (2006.01) |

(52) U.S. Cl.
CPC ............ *F16B 21/09* (2013.01); *F16M 13/02* (2013.01); *F16B 21/06* (2013.01); *F16M 11/00* (2013.01); *H05K 5/0204* (2013.01)

(58) Field of Classification Search
CPC ......... F16B 21/09; F16B 21/06; F16M 13/02; F16M 11/1048; F16M 11/16; F16M 11/06; F16M 11/00; H05K 5/0204

USPC .......... 248/551, 553, 219.4, 220.21, 221.11, 248/222.14, 222.41, 225.11, 230.8
See application file for complete search history.

(56) References Cited

U.S. PATENT DOCUMENTS

| | | | | |
|---|---|---|---|---|
| 6,347,489 | B1* | 2/2002 | Marshall, Jr. ........... | E02D 27/00 52/126.6 |
| 6,766,992 | B1* | 7/2004 | Parker .................. | F16M 13/022 248/219.3 |
| 7,997,546 | B1* | 8/2011 | Andersen .................. | F16B 2/06 248/230.8 |
| 9,394,717 | B2* | 7/2016 | Paananen ............ | E04H 12/2269 |
| 2005/0075105 | A1* | 4/2005 | Smith .................. | G06Q 10/047 455/424 |
| 2011/0083399 | A1* | 4/2011 | Lettkeman .............. | E04H 12/24 248/219.4 |
| 2011/0304518 | A1* | 12/2011 | Fruh .................... | H01Q 1/1228 343/882 |
| 2012/0001041 | A1* | 1/2012 | Yang .................... | H05K 5/0204 248/219.4 |

(Continued)

*Primary Examiner* — Tan Le
(74) *Attorney, Agent, or Firm* — Nixon Peabody LLP

(57) ABSTRACT

A mounting system is disclosed that includes a bracket configured to mount an object on a structure. The bracket includes a front panel, two side panels extending from the front panel, and a plurality of slots. Each slot is configured to accept a projection connected to the object and retain the projection within the slot. The bracket further includes a plurality of apertures. The mounting system further includes a retainer configured to extend into the bracket through the plurality of apertures and prevent, at least in part, the plurality of projections, retained by the bracket in the plurality of slots, from being withdrawn from the plurality of slots.

17 Claims, 9 Drawing Sheets

(56) References Cited

U.S. PATENT DOCUMENTS

2012/0211634 A1\* 8/2012 Yang ..................... H01Q 3/06
 248/397

\* cited by examiner

MOUNTING SYSTEM

CROSS-REFERENCE TO RELATED APPLICATION

This application claims priority under 35 U.S.C. § 119 to U.S. Provisional Application No. 63/089,198, titled "A SECURITY POLE-MOUNT FOR OUTDOOR COMMUNICATION EQUIPMENT," and filed on Oct. 8, 2020. The contents of that application are hereby incorporated by reference in their entirety.

FIELD OF THE INVENTION

The present invention relates to mounting systems for mounting an object to a structure, and specifically to a theft-resistant mounting system.

BACKGROUND

Electronic equipment is usually fixed to a structure, such as a pole, with a mounting bracket. The brackets generally are fixed on a pole with bolts and nuts. Alternatively, some brackets can be also fixed on the pole with steel rings. These types of mounting brackets need to lock the electronic equipment on the structure, which can be difficult to accomplish. These types of mounting brackets also do not provide theft-resistance.

Accordingly, there is a need for mounting systems that is easy to install on a structure and include theft resistance for securing an object on the structure. Aspects of the present disclosure solve this and other problems.

SUMMARY

According to one embodiment, a mounting system is disclosed that includes a bracket configured to mount an object on a structure. The bracket includes a front panel and two side panels extending from the front panel. The bracket further includes a plurality of slots. Each slot is configured to accept a projection connected to the object and to retains the projection within the slot. The bracket further includes a plurality of apertures. The mounting system further includes a retainer configured to extend into the bracket through the plurality of apertures and prevent, at least in part, the plurality of projections, retained by the bracket in the plurality of slots, from being withdrawn from the plurality of slots.

According to an aspect of the embodiment, the plurality of slots is on the front panel, and the plurality of apertures is on at least one of the two side panels. According to another aspect of the embodiment, the retainer slides into the bracket from one side of the two side panels and behind the front panel. According to another aspect of the embodiment, each slot includes a narrow portion and a wide portion. The retainer is configured to prevent the plurality of projections from moving between being retained in the narrow portions of the plurality of slots to the wide portions of the plurality of slots. According to another aspect of the embodiment, the retainer includes a plurality of wide portions. Each wide portion of the retainer is aligned with a slot of the plurality of slots with the retainer extended into the bracket. According to another aspect of the embodiment, the retainer includes a plurality of arms. Each arm is configured to extend into the bracket through a first aperture on a first one of the two side panels, and out of the bracket through a second aperture on a second one of the two side panels, opposite from the first aperture. According to another aspect of the embodiment, each slot is configured to accept the projection with the projection in a first position relative to the slot, and configured to retain the projection with the projection in a second position relative to the slot. According to another aspect of the embodiment, the first position corresponds to a wide portion of the slot, and the second position corresponds to a narrow portion of the slot. According to another aspect of the embodiment, the mounting system further includes a theft-resistant bolt configured to secure the retainer to the bracket and resist the retainer from being removed from the bracket without a corresponding tool compatible with the theft-resistant bolt. According to another aspect of the embodiment, the mounting system includes a first hole in the bracket, and a second hole in the retainer. The first hole and the second hole are aligned with the retainer inserted into the bracket. The theft-resistant bolt is configured to engage the first hole and the second hole to secure the retainer to the bracket. According to another aspect of the embodiment, the mounting system includes a second bracket configured to couple to the object and be between the object and the first bracket. The plurality of projections extends from the second bracket. According to another aspect of the embodiment, the plurality of projections is integral with the second bracket. According to another aspect of the embodiment, the second bracket is configured to accept a plurality of different arrangements of fasteners for coupling to a plurality of different objects. According to another aspect of the embodiment, each one of the two side panels includes a plurality of slots configured to accept bands that secure the bracket to the structure.

According to another embodiment, a system is disclosed that includes an object to be mounted to a structure and a plurality of projections connected to one side of the object. The system further includes a mounting system that includes a bracket configured to be placed against the structure for mounting the object on the structure. The bracket includes a front panel, two side panels extending from the front panel, and a plurality of slots. Each slot is configured to accept a projection of the plurality of projections and retain the projection within the slot. The bracket further includes a plurality of apertures. The mounting system further includes a retainer configured to extend into the bracket through the plurality of apertures and prevent, at least in part, the plurality of projections, retained by the bracket in the plurality of slots, from being withdrawn from the plurality of slots.

According to one aspect of the embodiment, the plurality of projections is a plurality of fasteners that are removably coupled to the object. According to another aspect of the embodiment, each fastener of the plurality of fasteners is a bolt with a narrow portion and a wide portion. According to another aspect of the embodiment, the mounting system further includes a second bracket, and the plurality of projections are integral with the second bracket. According to another aspect of the embodiment, the second bracket is secured to the object and located between the object and the first bracket. According to another aspect of the embodiment, the second bracket is configured to accept a plurality of different arrangements of fasteners for coupling to a plurality of different objects.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure, and its advantages and drawings, will be better understood from the following description of embodiments together with reference to the accompanying drawings. These drawings depict only embodiments and are, therefore, not to be considered as limitations on the scope of the various embodiments or claims.

DETAILED DESCRIPTION

Figure 1A:
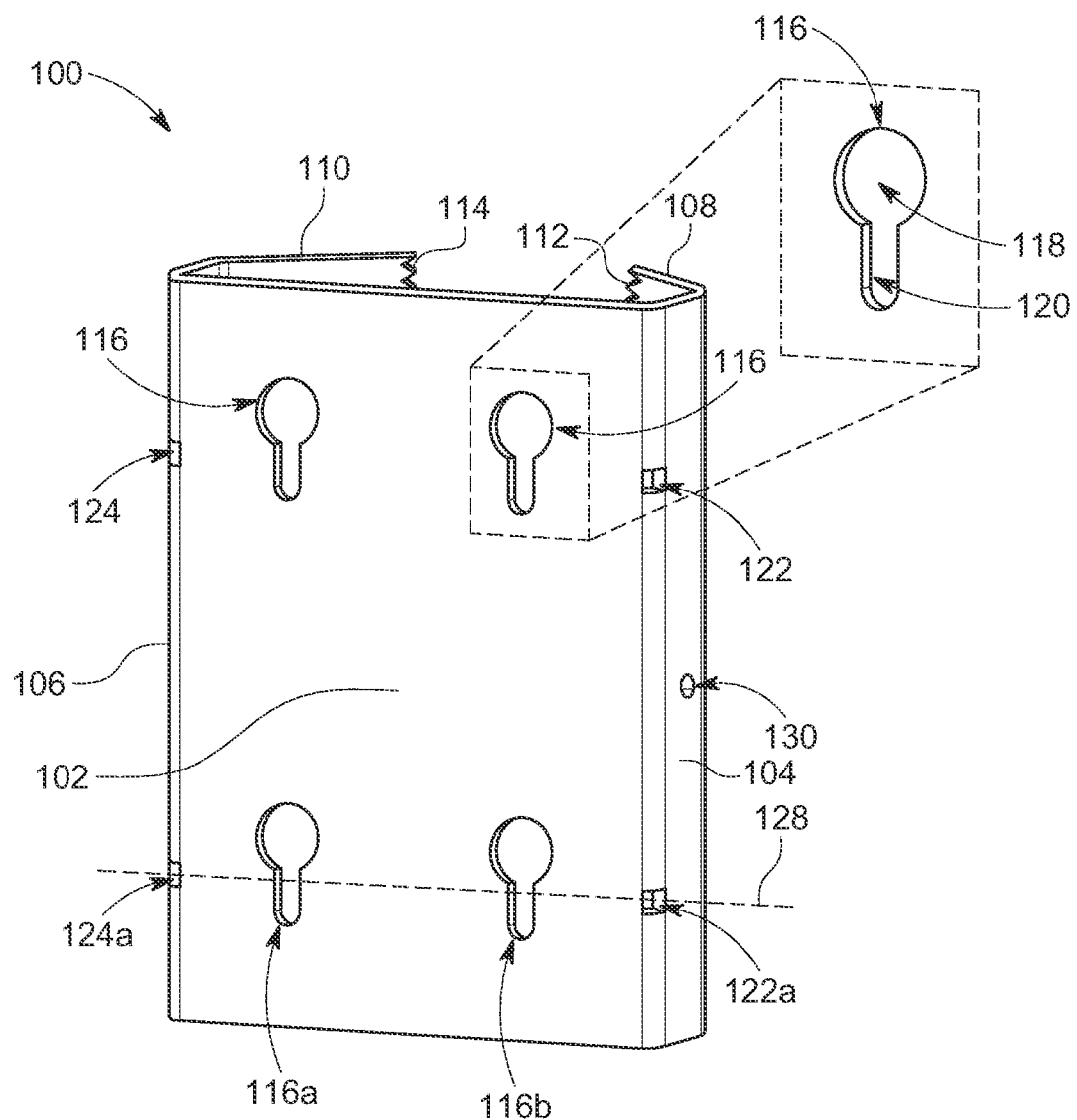
FIG. 1A is a right-side perspective view depicting a bracket of a mounting system, according to aspects of the present disclosure.

The various embodiments are described with reference to the attached figures, where like reference numerals are used throughout the figures to designate similar or equivalent elements. The figures are not drawn to scale, and they are provided merely to illustrate the instant invention. It should be understood that numerous specific details, relationships, and methods are set forth to provide a full understanding. One having ordinary skill in the relevant art, however, will readily recognize that the various embodiments can be practiced without one or more of the specific details, or with other methods. In other instances, well-known structures or operations are not shown in detail to avoid obscuring certain aspects of the various embodiments. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

Figure 1B:
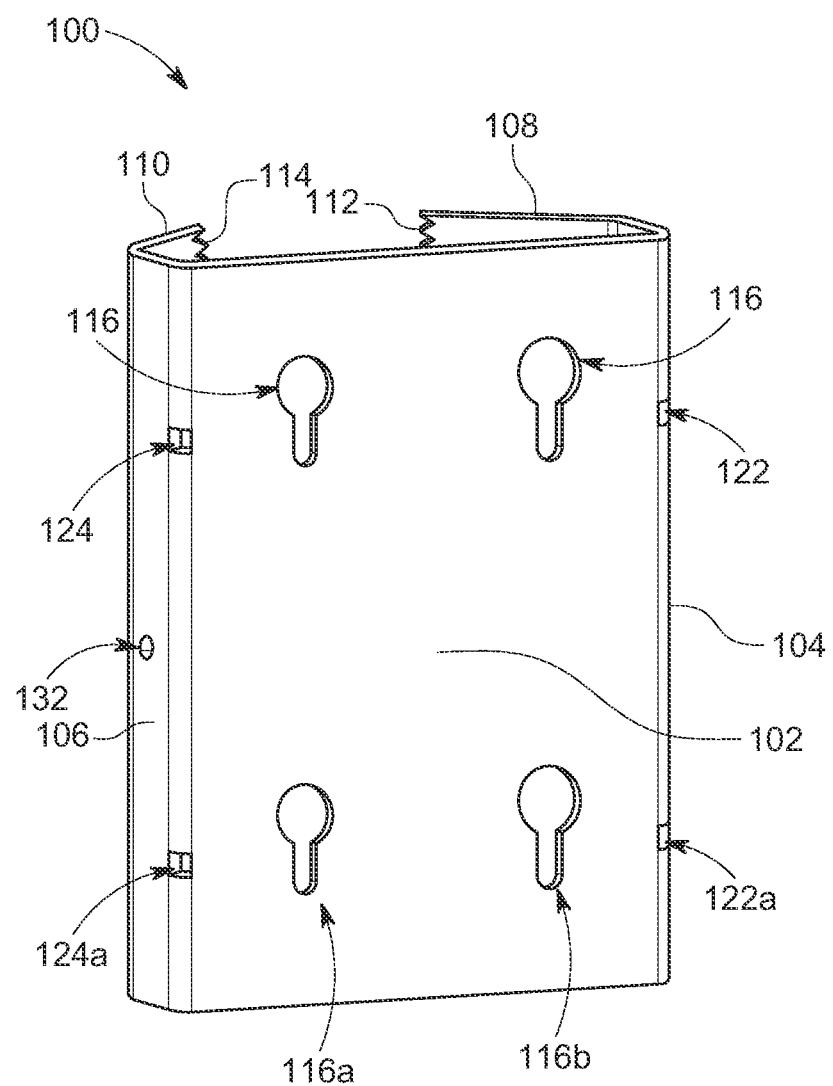
FIG. 1B is a left-side perspective view depicting the bracket of FIG. 1A, according to aspects of the present disclosure.

Referring to FIGS. 1A and 1B, shown are a right-side perspective view (FIG. 1A) and a left-side perspective view (FIG. 1B) of a bracket 100, according to aspects of the present disclosure. The bracket 100 includes a front panel 102 and two side panels 104 and 106 that extend from the front panel 102. The bracket 100 further includes two rear panels 108 and 110 that extend from the side panels 104 and 106, respectively. The rear panels 108 and 110 are configured to contact a structure, such as a pole (FIG. 2), for mounting an object (FIG. 4) onto the structure. In one or more embodiments, the rear panels 108 and 110 can have teeth 112 and 114, where the rear panels 108 and 110 contact the structure to assist with maintaining the bracket 100 against the structure.

Although the side panels 104 and 106 and the rear panels 108 and 110 are shown and described, in one or more embodiments the bracket 100 may not include one or more of the side panels 104 and 106 and the rear panels 108 and 110. For example, depending on the size and shape of the structure on to which the bracket 100 is to be mounted, the bracket 100's shape and or size may be adjusted. This adjustment can include, for example, omitting one or more of the side panels 104 and 106 and the rear panels 108 and 110, or changing the size and/or shape of one or more of the side panels 104 and 106 and the rear panels 108 and 110.

The front panel 102 of the bracket 100 includes a plurality of slots 116. In one or more embodiments, each slot 116 is formed as an aperture through the bracket 100, and specifically through the front panel 102. However, the configuration of the slots 116 can vary. For example, the slots 116 can instead be channels or grooves formed on the front panel 102, rather than apertures through the front panel 102.

Focusing on the detailed portion of FIG. 1A, each slot 116 can include a wide or open portion 118 and a narrow or restricted portion 120. The wide portion 118 is sized so as to allow a projection (FIG. 3) to extend into and/or through the slot 116. For example, the wide portion 118 can generally have a shape of a circle, with the diameter of the circle being sized to allow a projection (FIG. 3) to extend through the slot 116.

The narrow portion 120 is sized so as to prevent the projection (FIG. 3) from being withdrawn from the slot 116 when the projection extends through the narrow portion 120. Thus, and as discussed further below with respect to FIG. 3, the projection is secured to the bracket 100, at least in part, when the projection extends through the narrow portion 120 of the slot 116.

The front panel 102 can include any number of slots 116, such as one slot 116, two slots 116, four slots 116, six slots 116, ten slots 116, etc. The slots 116 can be arranged in any geometry on the front panel 102, such as generally a two-by-two matrix, as illustrated in FIGS. 1A and 1B, a horizontal line, a vertical line, a slanted line, a triangle, a diamond, a larger or smaller matrix (e.g., one-by-two, two-by-three, etc.), etc.

The slots 116 can all be the same size, as illustrated in FIGS. 1A and 1B. Alternatively, the slots 116 can be different sizes, such as each slot 116 being a different size, or sets of slots 116 being different sizes, etc. For example, one set of slots 116 can define a first geometric shape on the front panel 102 and be a certain size. Another set of slots 116 can define a second geometric shape (same or different than first geometric shape) and be a different size.

The two side panels 104 and 106 include a plurality of apertures 122 and 124, respectively. In one or more embodiments, each aperture 122 on, for example, the side panel 104 has a corresponding aperture 124 on the side panel 106. For example, the aperture 122a on the side panel 104 has a corresponding aperture 124a on the side panel 106. The corresponding apertures 122a and 124a form a pair of apertures 122a/124a. As shown in FIG. 1A, each pair of apertures 122a/124a defines an axis 128 that extends across the pair of slots 116a and 116b.

In one or more embodiments, where the slots 116 are raised channels or grooves on the front panel 102, the apertures 122 and/or 124 can instead be on the sides of the raised channels or grooves.

The side panels 104 and 106 further include holes 130 (FIG. 1A) and 132 (FIG. 1B), respectively. The holes 130 and 132 allow a retainer (FIG. 5) to be secured to the bracket 100, as discussed further below. In one or more embodiments, both of the holes 130 and 132 can be threaded, or smooth, or one smooth and one threaded. Although the side panels 104 and 106 include only the one hole 130 and the one hole 132, respectively, each one or both of the side panels 104 and 106 can include more than the one hole, such as two holes, three holes, four holes, etc. Alternatively, rather than both of the side panels 104 and 106 having holes 130 and 132, only one of the side panels 104 and 106 may have the holes.

Figure 2:
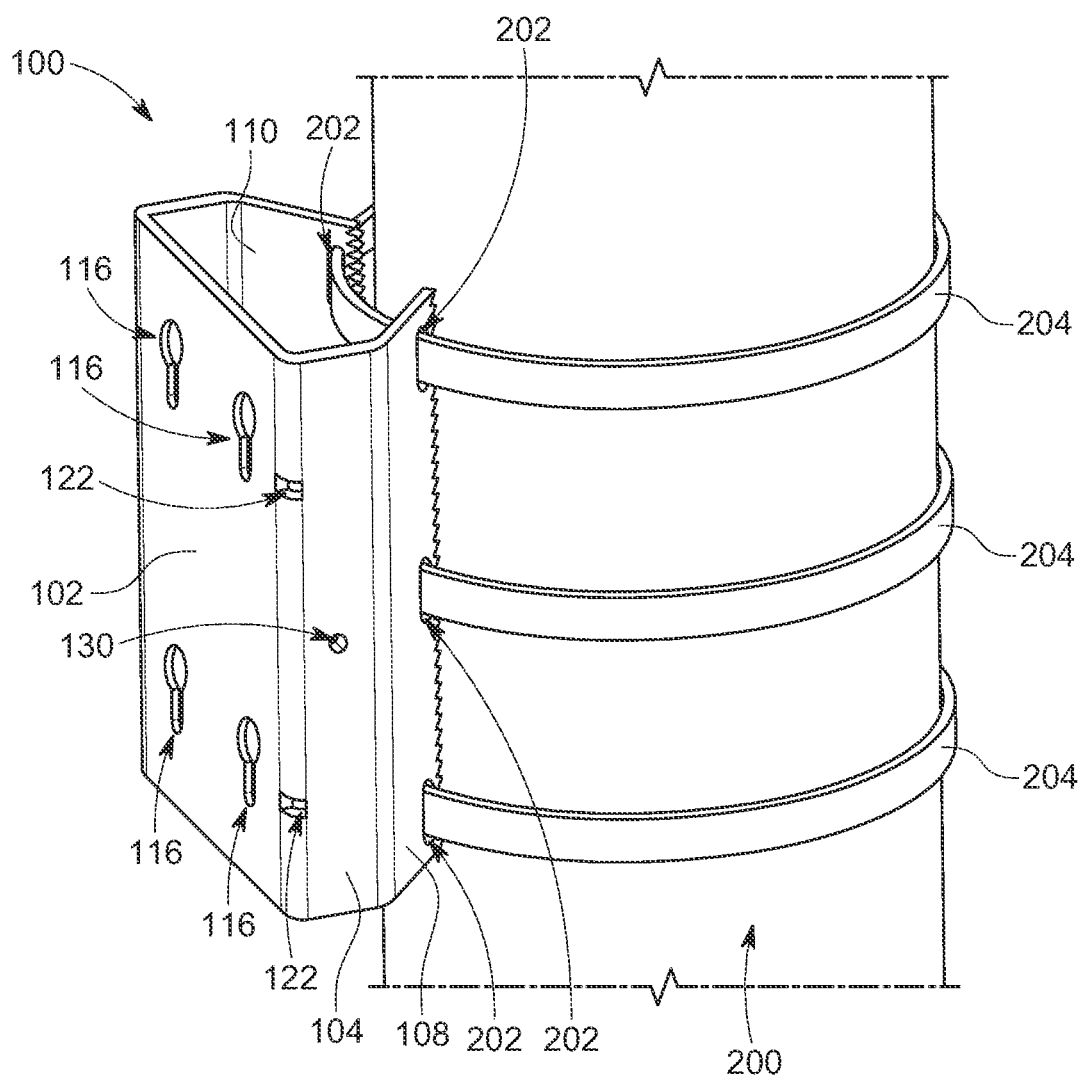
FIG. 2 is a perspective view depicting a bracket fixed to a structure, according to aspects of the present disclosure.

Referring to FIG. 2, the bracket 100 of FIGS. 1A and 1B is shown mounted on a structure 200, according to aspects of the present disclosure. The structure 200 can be, for example, a pole, as illustrated in FIG. 2. However, the structure 200 can be any other type of structure, such as a wall, a building, a vehicle, etc. As discussed above, the teeth 112 and 114 (both in FIGS. 1A, 1B) of the rear panels 108 and 110, respectively, can engage the structure 200 to assist in fastening the bracket 100 against the structure 200.

The bracket 100 includes one or more apertures 202 on each of the rear panels 108 and 110. Bands 204 can wrap around the structure 200 and pass through the apertures 202 to fasten the bracket 100 against the structure 200. The bands 204 can be formed of steel, plastic, rubber, etc. Alternative ways of mounting of the bracket 100 to the structure 200 are disclosed, such as any type of fastener (e.g., screw, nail, bolt, theft-resistant bolt, etc.) that engages with both the bracket 100 and the structure 200.

Figure 3A:
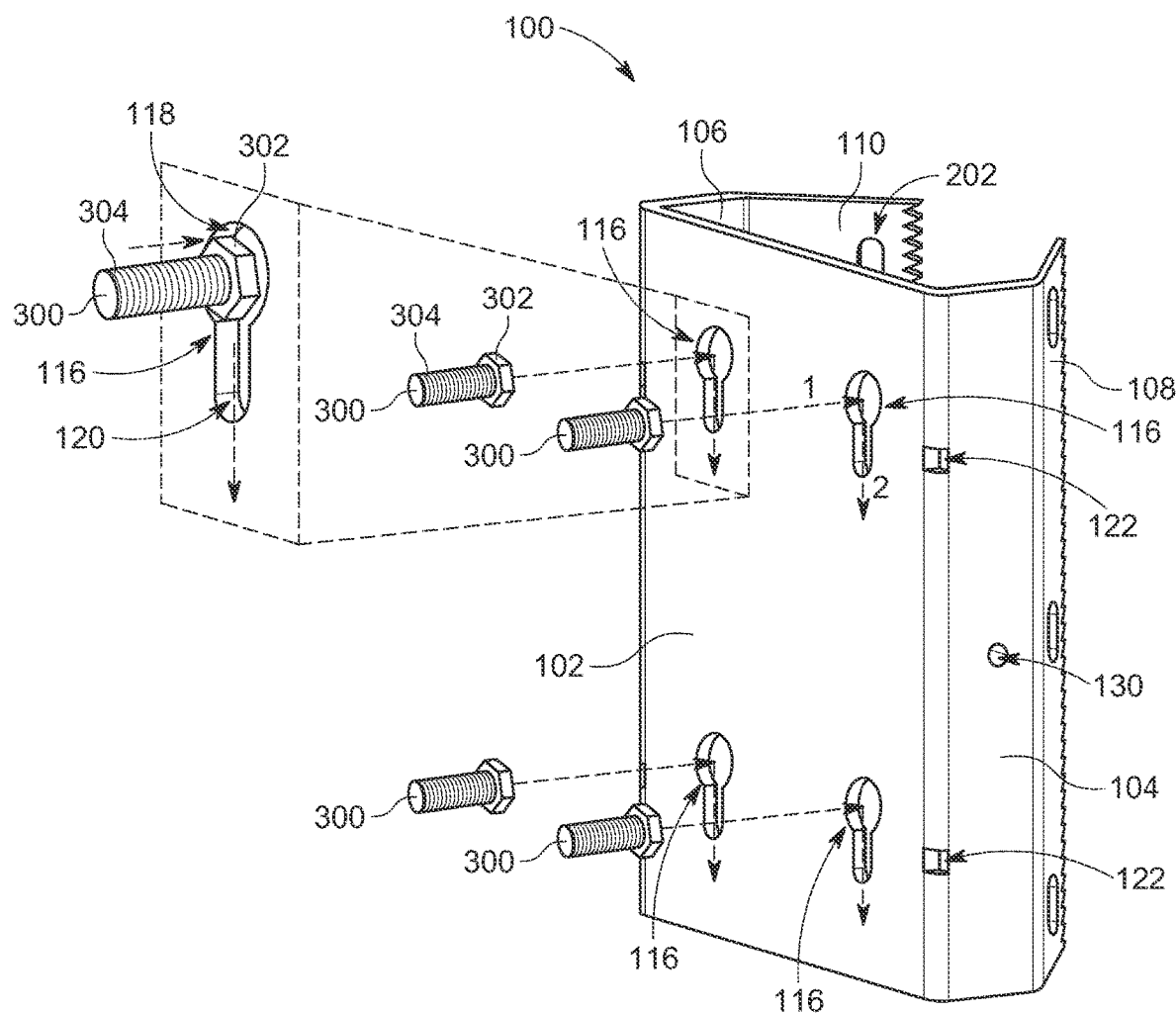
FIG. 3A is a perspective view depicting a bracket receiving projections, according to aspects of the present disclosure.

Referring to FIG. 3A, the bracket 100 is shown with fasteners 300 being inserted into the slots 116, according to aspects of the present disclosure. As described below with respect to FIG. 4, the fasteners 300 are configured to fit in the slots 116 and also to be coupled to the object. As shown in the detailed portion of FIG. 3A, the fasteners 300 are shown being inserted into the wide portions 118 of the slots 116. The fasteners 300 are inserted into the wide portions 118 to accommodate the wide portions 302 (e.g., heads) of the fasteners 300. For example, the fasteners 300 can be bolts. The wide portions 118 of the slots 116 are sized to allow the heads 302 of the fasteners 300 to fit through the slots 116. Although shown as being bolts, the fasteners 300 can be any shape and/or any type of fastener that includes a wide portion or head, such as a screw, a nail, a square bolt, etc. The fasteners 300 being inserted into the wide portions 118 of the slots 116 is considered herein as the fasteners 300 being in a first position relative to the slots 116. The first position is an insertion and withdrawal position of the fasteners 300 relative to the slots 116.

Figure 3B:
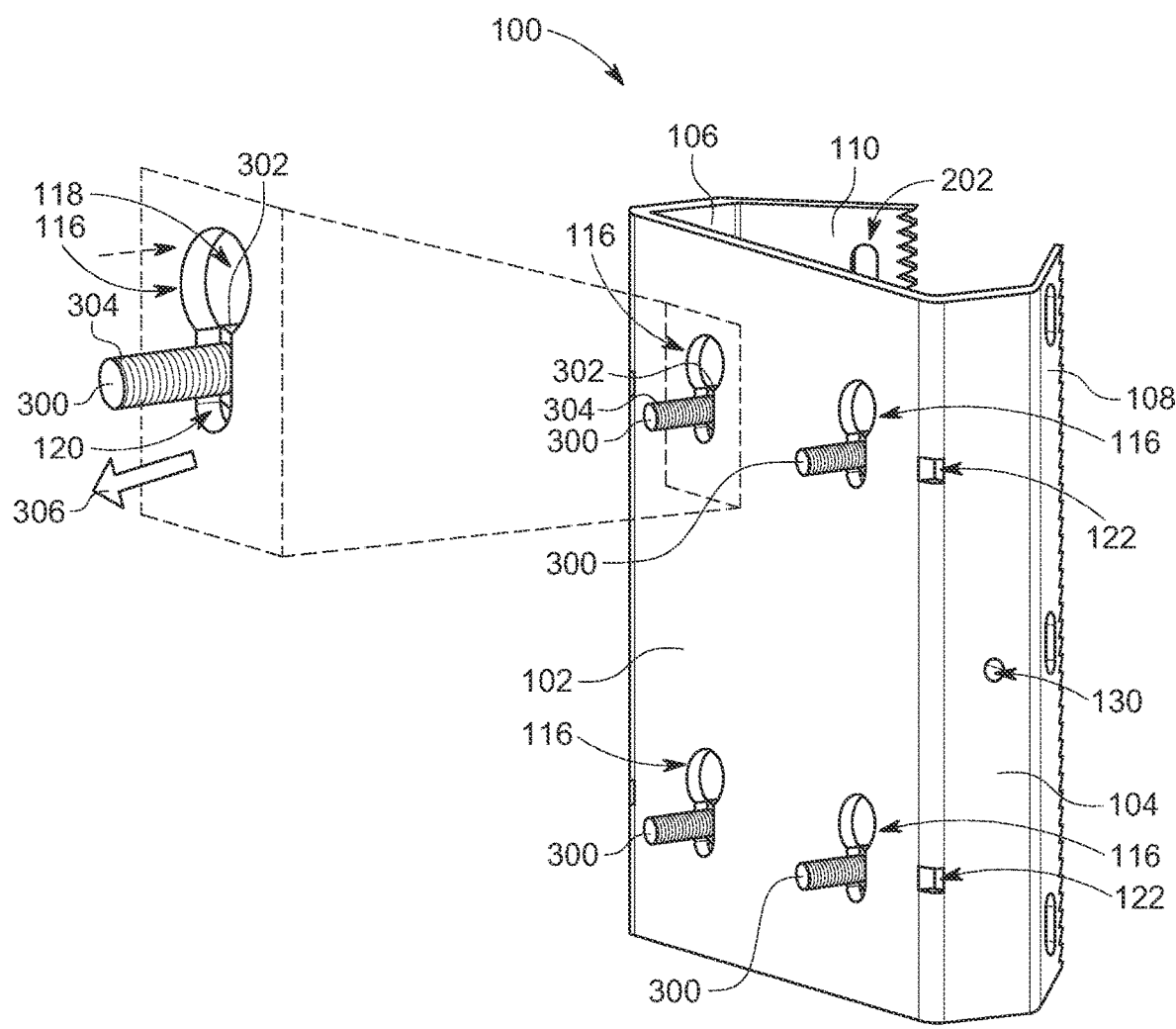
FIG. 3B is a perspective view depicting the bracket of FIG. 3A retaining the projections, according to aspects of the present disclosure.

Referring FIG. 3B, the bracket 100 is shown with the fasteners 300 inserted into the slots 116 in a second position, according to aspects of the present disclosure. Specifically, and as shown in the detailed portion of FIG. 3B, the fasteners 300 have been inserted into the slots 116 and transitioned (e.g., lowered) into the narrow portions 120 of the slots 116. The narrow portions 120 of the slots 116 are sized so as to accommodate the narrow portions 304 of the fasteners 300. However, the narrow portions 120 of the slots 116 are sized so as to prevent the heads 302 of the fasteners 300 from being withdrawn from the slots 116. Accordingly, with the fasteners 300 in the second position relative to the slots 116—specifically in the narrow portions 120 of the slots 116—the fasteners 300 cannot be withdrawn from the slots 116 in a direction generally normal to the front panel 102, as represented by the arrow 306.

Figure 4:
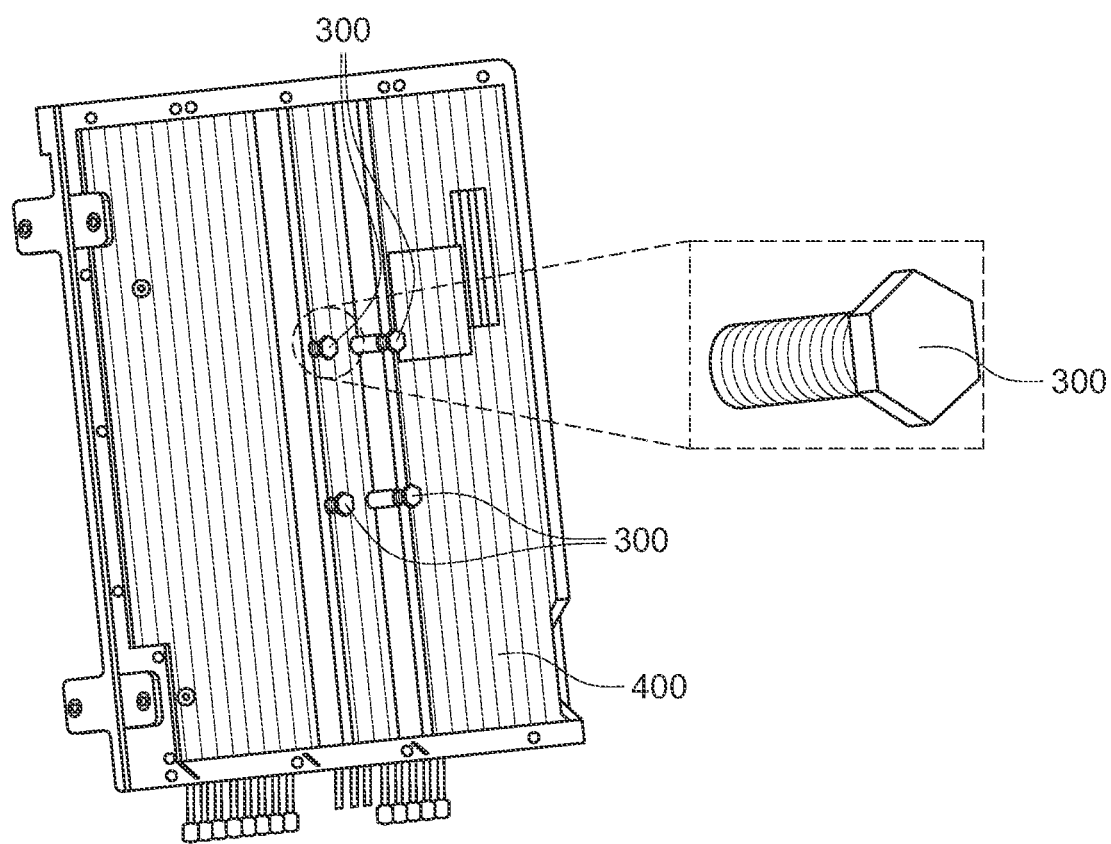
FIG. 4 is a perspective view depicting an object to be mounted on a structure, according to aspects of the present disclosure.

FIG. 4 shows the fasteners 300 of FIGS. 3A and 3B connected to an object 400 that is to be secured to a structure (e.g., structure 200 in FIG. 2). For example, the fasteners 300 in the form of bolts can be screwed into the object 400; can be soldered into the object 400; can be formed integral with the object 400, etc. The pattern of the fasteners 300 on the object 400 is arranged to match the pattern of the slots 116 on the bracket 100 (FIGS. 3A and 3B).

Figure 5A:
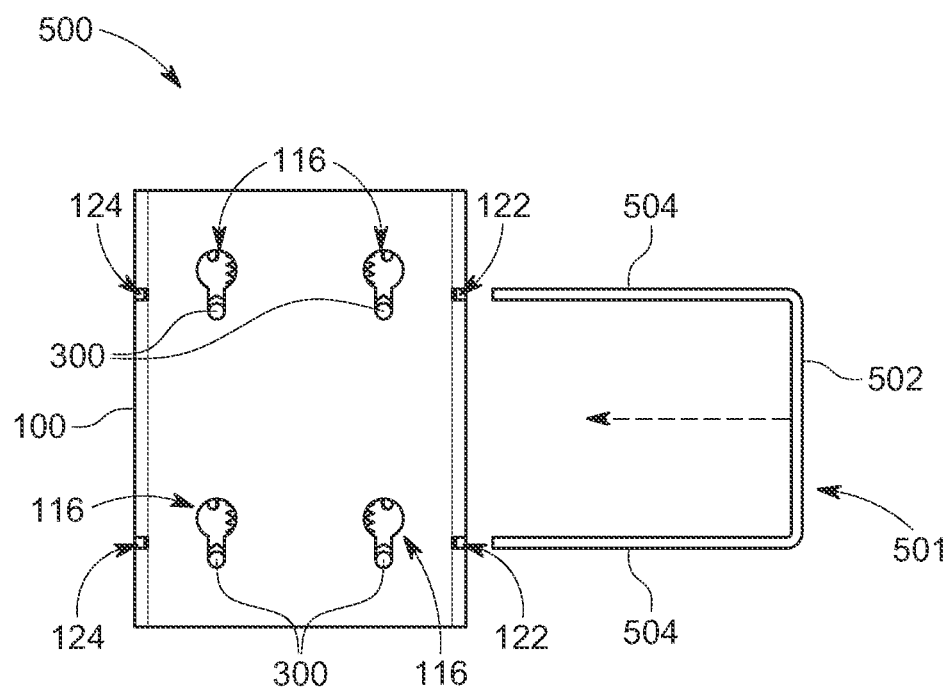
FIG. 5A is a side view of a mounting system, according to aspects of the present disclosure.
Figure 5B:
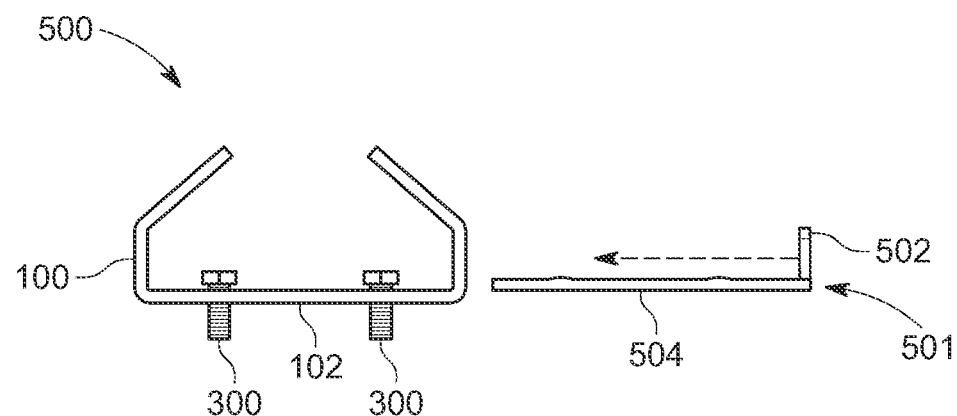
FIG. 5B is a top view of the mounting system of FIG. 5A, according to aspects of the present disclosure.

Referring to FIGS. 5A and 5B, shown are a front view and a top view, respectively, of a mounting system 500, according to aspects of the present disclosure. Focusing first on FIG. 5A, the fasteners 300 are in the second position relative to the slots 116. Thus, the fasteners 300 cannot be withdrawn from the bracket 100 unless moved into the first position, as described above (FIG. 3A). A retainer 501 is brought in alignment with the apertures 122 on the side panel 104. The retainer 501 includes a body 502 and two arms. The two arms 504 extend from the body 502. Each arm 504 is sized to fit through an aperture 122. The arms 504 are spaced apart on the body 502 of the retainer 501 to match the spacing of the apertures 122 on the bracket 100. Referring to FIG. 5B, the arms 504 of the retainer 501 are positioned relative to the bracket 100 to slide into the apertures 122 and behind the front panel 102 of the bracket 100.

Figure 6A:
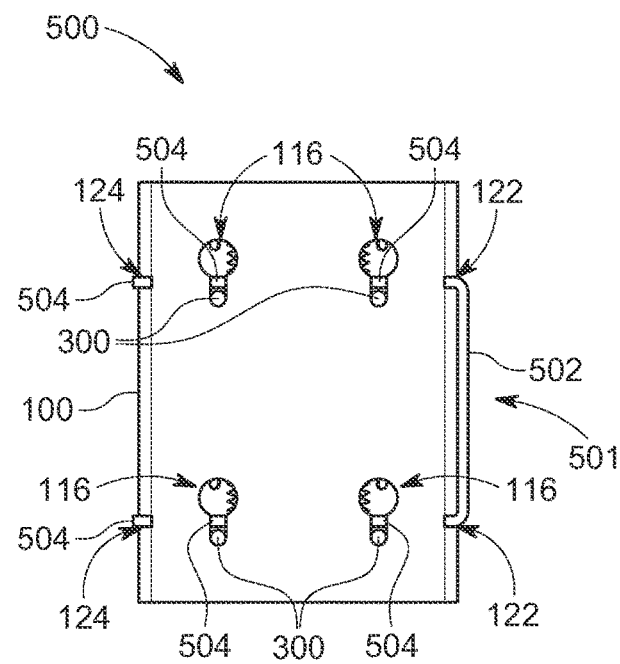
FIG. 6A is a side view of a mounting system, according to aspects of the present disclosure.
Figure 6B:
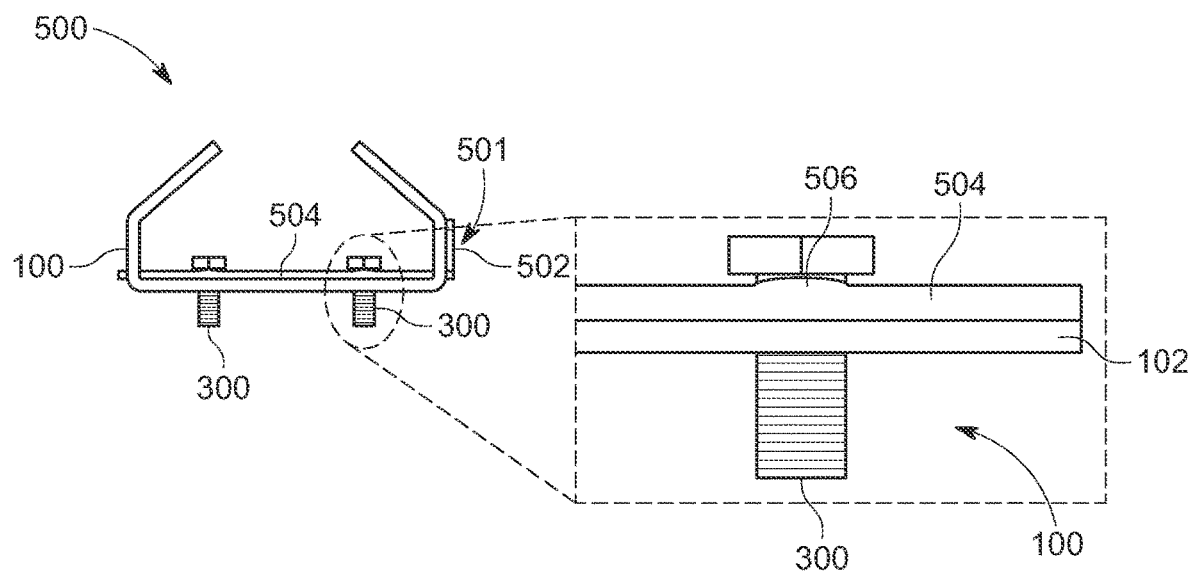
FIG. 6B is a top view of the mounting system of FIG. 6A, according to aspects of the present disclosure.

Referring to FIGS. 6A and 6B, shown are a front view and a top view, respectively, of the mounting system 500 of FIGS. 5A and 5B, according to aspects of the present disclosure. With the retainer 501 fully inserted into the bracket 100, the arms 504 partially extend out of the apertures 124. Further, the arms 504 extend from the apertures 122 to the apertures 124, crossing the slots 116 above the fasteners 300. Referring to FIG. 6B, the arms 504 extend behind the front panel 102 of the bracket 100. The positioning of the arms 504 relative to the slots 116, and the fasteners 300 being in the slots 116, prevents the fasteners 300 from transitioning to the first position described above (FIG. 3A). In other words, the arms 504 keep the fasteners 300 in the narrow portions 120 of the slots 116 (FIGS. 3A, 3B). Thus, the arms 504 prevent the fasteners 300 from vertically moving within the slots 116. As shown in the detailed portion of FIG. 6B, the arms 504 of the retainer 501 can include a wide portion 506 to provide greater contact area with the fastener 300. With the fasteners 300 in the narrow portions 120 of the slots 116, and the retainer 501 inserted into the bracket 100, as shown in FIGS. 6A and 6B, the fasteners 300 are restricted from being withdrawn from the bracket 100. With an object (e.g., object 400 in FIG. 4)

connected to the fasteners 300, the fasteners 300 and the retainer 501 similarly restrict the object from being removed from the bracket 100.

Figure 7:
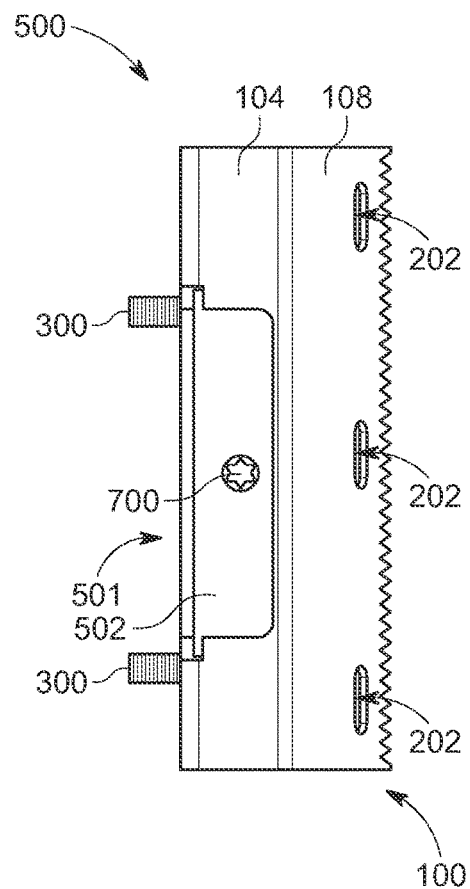
FIG. 7 is a side view of the mounting system of FIGS. 6A and 6B, according to aspects of the present disclosure.

Referring to FIG. 7, shown is a side view, respectively, of the mounting system 500 of FIGS. 6A and 6B, according to aspects of the present disclosure. To secure the retainer 501 to the bracket 100 and also resist the retainer 501 from being removed from the bracket 100, a theft-resistant fastener 700 can be used to secure the retainer 501 to the bracket 100. The theft-resistant fastener 700 can be any type of theft-resistant fastener, such as a screw or a bolt that requires a special tool for removal. For example, the theft-resistant fastener 700 can engage the hole 130 (FIG. 1) in the bracket 100. The retainer 501 can include a corresponding hole (not shown) that the theft-resistant fastener 700 also engages.

With the bracket 100 secured against a structure (e.g., structure 200 in FIG. 2), and an object (e.g., object 400 in FIG. 4) connected to fasteners 300 that are secured to the bracket 100 with a retainer 501, the resulting arrangement allows the object to be fastened to the structure in an arrangement that resists removal of the object unless the theft-resistant fastener 700 is removed.

Figure 8:
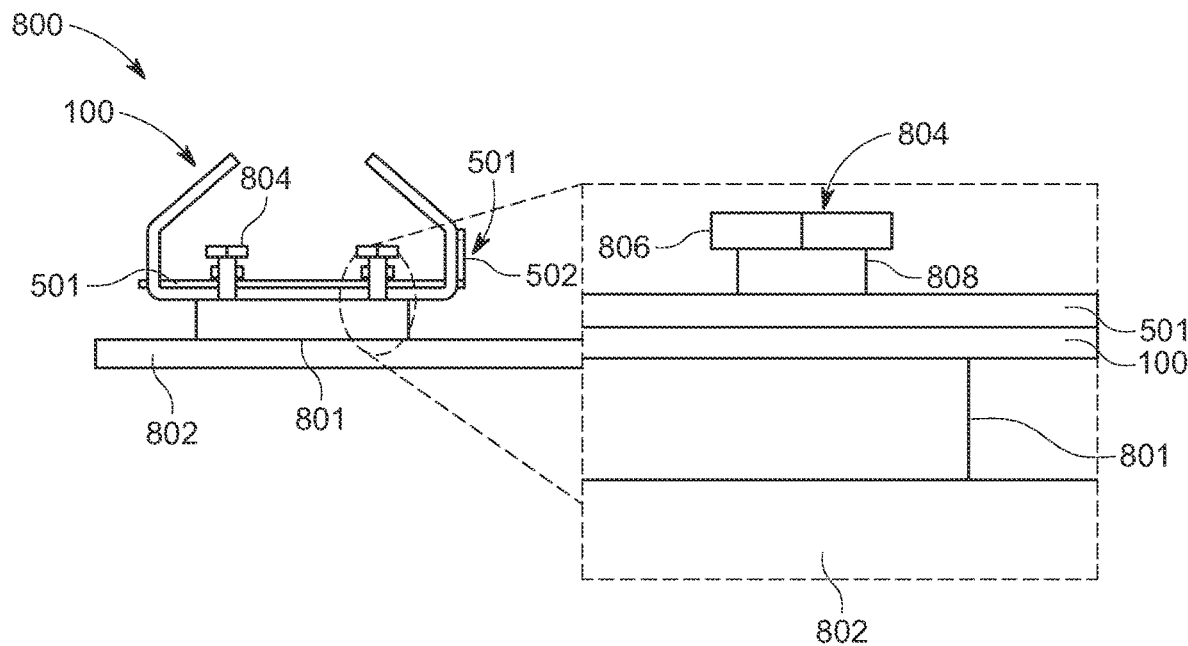
FIG. 8 is a top view of another mounting system, according to aspects of the present disclosure.

The fasteners that are inserted into the slots of the bracket are described above as coupling to the object. However, generally the fasteners can be any projection that is connected, either directly or indirectly, to an object that is to be coupled to the bracket. Thus, the fasteners discussed above are considered a specific type of projection that can fit through the slots for securing an object also connected to the projections to the bracket. More broadly, the projections can extend directly from the object being secured. For example, the projections can be integral or removably attached to the object being secured, as discussed above. Alternatively, however, the projections can be integral or coupled to another object, such as a second bracket. The second bracket can then be secured to the object that is to be secured to the bracket. The second bracket can then secure to the bracket via the projections. Any fasteners, if present, can instead secure the object to the second bracket. FIG. 8 shows such an arrangement.

Referring to FIG. 8, illustrated is top view of another mounting system 800, according to aspects of the present disclosure. The bracket 100 and the retainer 501 are as described above. However, instead of the fasteners 300 extending through the bracket 100 to secure an object 802, projections 804 from the second bracket 801 extend through the bracket 100. As shown in the detailed portion of FIG. 8, the projections 804 include a wide portion 806 and a narrow portion 808 that are similar to the wide portions 302 and the narrow portions 304 of the fasteners 300 described above (e.g., FIGS. 3A and 3B). Thus, the wide portion 806 allows the projections 804 to be secured by the slots (FIGS. 1A and 1B) of the bracket 100, similar to the wide portions 302 of the fasteners 300.

The projections 804 extend from the second bracket 801. The second bracket 801 can connect to the object 802 with any type of fastener(s) that allows for the object 802 to be secured to the second bracket 801. In one or more embodiments, the second bracket 801 can provide a consistent arrangement of the projections 804 for securing the second bracket 801 to the bracket 100. Yet, the second bracket 801 can have more sets of, for example, holes and/or fasteners for securing to multiple different types and/or kinds of objects 802. In other words, the second bracket 801 can be a universal bracket that allows the object 802, which may otherwise be incompatible with the bracket 100, to still connect to the bracket 100 and be secured to a structure (FIG. 2).

While various embodiments of the present invention have been described above, it should be understood that they have been presented by way of example only, and not limitation. Numerous changes to the disclosed embodiments can be made in accordance with the disclosure herein without departing from the spirit or scope. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A mounting system comprising:
 a bracket configured to mount an object on a structure, the bracket including:
  a front panel;
  two side panels extending from the front panel;
  a plurality of slots, each slot being configured to accept a projection connected to the object and retain the projection within the slot, and each slot including a narrow portion and a wide portion; and
  a plurality of apertures; and
 a retainer configured to extend into the bracket through the plurality of apertures and prevent, at least in part, the plurality of projections, retained by the bracket in the plurality of slots, from being withdrawn from the plurality of slots by preventing the plurality of projections from moving between being retained in the narrow portions of the plurality of slots to the wide portions of the plurality of slots.

2. The mounting system of claim 1, wherein the plurality of slots is on the front panel and the plurality of apertures is on at least one of the two side panels.

3. The mounting system of claim 2, wherein the retainer slides into the bracket from one side of the two side panels and behind the front panel.

4. The mounting system of claim 1, wherein the retainer includes a plurality of wide portions, each wide portion of the retainer being aligned with a slot of the plurality of slots with the retainer extended into the bracket.

5. The mounting system of claim 1, wherein the retainer includes a plurality of arms, each arm being configured to extend into the bracket through a first aperture on a first one of the two side panels and out of the bracket through a second aperture on a second one of the two side panels, opposite from the first aperture.

6. The mounting system of claim 1, further comprising:
a theft-resistant bolt configured to secure the retainer to the bracket and resist the retainer from being removed from the bracket without a corresponding tool compatible with the theft-resistant bolt.

7. The mounting system of claim 6, further comprising:
a first hole in the bracket; and
a second hole in the retainer,
wherein the first hole and the second hole are aligned with the retainer inserted into the bracket, and the theft-resistant bolt is configured to engage the first hole and the second hole to secure the retainer to the bracket.

8. The mounting system of claim 1, further comprising:
a second bracket configured to couple to the object and be between the object and the first bracket,
wherein the plurality of projections extends from the second bracket.

9. The mounting system of claim 8, wherein the plurality of projections is integral with the second bracket.

10. The mounting system of claim 8, wherein the second bracket is configured to accept a plurality of different arrangements of fasteners for coupling to a plurality of different objects.

11. The mounting system of claim 1, wherein each one of the two side panels includes a plurality of slots configured to accept bands that secure the bracket to the structure.

12. A system comprising:
an object to be mounted to a structure;
a plurality of projections connected to one side of the object; and
a mounting system including:
a bracket configured to be placed against the structure for mounting the object on the structure, the bracket including:
a front panel;
two side panels extending from the front panel;
a plurality of slots, each slot being configured to accept a projection of the plurality of projections and retain the projection within the slot, and each slot including a narrow portion and a wide portion; and
a plurality of apertures; and
a retainer configured to extend into the bracket through the plurality of apertures and prevent, at least in part, the plurality of projections, retained by the bracket in the plurality of slots, from being withdrawn from the plurality of slots by preventing the plurality of projections from moving between being retained in the narrow portions of the plurality of slots to the wide portions of the plurality of slots.

13. The system of claim 12, wherein the plurality of projections is a plurality of fasteners that are removably coupled to the object.

14. The system of claim 13, wherein each fastener of the plurality of fasteners is a bolt with a narrow portion and a wide portion.

15. The system of claim 12, wherein the mounting system further comprises a second bracket, and the plurality of projections are integral with the second bracket.

16. The system of claim 15, wherein the second bracket is secured to the object and located between the object and the first bracket.

17. The system of claim 15, wherein the second bracket is configured to accept a plurality of different arrangements of fasteners for coupling to a plurality of different objects.

* * * * *